US006911695B2

United States Patent
Ahmed et al.

(10) Patent No.: US 6,911,695 B2
(45) Date of Patent: Jun. 28, 2005

(54) TRANSISTOR HAVING INSULATING SPACERS ON GATE SIDEWALLS TO REDUCE OVERLAP BETWEEN THE GATE AND DOPED EXTENSION REGIONS OF THE SOURCE AND DRAIN

(75) Inventors: Shafqat Ahmed, San Jose, CA (US); Henry Chao, San Jose, CA (US); DerChang Kau, Cupertino, CA (US)

(73) Assignee: Intel Corporation, Santa, CA (US)

( * ) Notice: Subject to any disclaimer, the term of this patent is extended or adjusted under 35 U.S.C. 154(b) by 0 days.

(21) Appl. No.: 10/247,027

(22) Filed: Sep. 19, 2002

(65) Prior Publication Data

US 2004/0056301 A1 Mar. 25, 2004

(51) Int. Cl.[7] .......................... H01L 29/76; H01L 29/94; H01L 31/062; H01L 31/113; H01L 31/119
(52) U.S. Cl. .................... 257/336; 257/344; 257/408
(58) Field of Search ................. 257/336, 344, 257/408

(56) References Cited

U.S. PATENT DOCUMENTS

| | | | |
|---|---|---|---|
| 4,356,623 A | 11/1982 | Hunter | |
| 5,013,691 A | 5/1991 | Lory et al. | |
| 5,183,771 A * | 2/1993 | Mitsui et al. | 438/302 |
| 5,291,052 A * | 3/1994 | Kim et al. | 257/369 |
| 5,296,401 A * | 3/1994 | Mitsui et al. | 438/231 |
| 5,302,555 A | 4/1994 | Yu | |
| 5,543,654 A | 8/1996 | Dennen | |
| 5,663,586 A * | 9/1997 | Lin | 257/336 |
| 5,710,450 A | 1/1998 | Chau et al. | |
| 5,714,413 A | 2/1998 | Brigham et al. | |
| 5,719,423 A * | 2/1998 | Todd et al. | 257/336 |
| 5,780,912 A | 7/1998 | Burr et al. | |
| 5,838,051 A * | 11/1998 | Yen et al. | 257/412 |
| 5,908,313 A | 6/1999 | Chau et al. | |
| 5,925,914 A * | 7/1999 | Jiang et al. | 257/344 |
| 5,929,483 A * | 7/1999 | Kim et al. | 257/336 |
| 5,943,565 A * | 8/1999 | Ju | 438/231 |
| 5,976,939 A | 11/1999 | Thompson et al. | |
| 5,998,274 A * | 12/1999 | Akram et al. | 438/306 |
| 6,043,545 A * | 3/2000 | Tseng et al. | 257/408 |
| 6,093,610 A | 7/2000 | Rodder | |
| 6,107,149 A * | 8/2000 | Wu et al. | 438/303 |
| 6,121,100 A | 9/2000 | Andideh et al. | |
| 6,157,064 A * | 12/2000 | Huang | 257/344 |
| 6,165,826 A | 12/2000 | Chau et al. | |
| 6,184,566 B1 * | 2/2001 | Gardner et al. | 257/510 |
| 6,190,981 B1 | 2/2001 | Lin et al. | |
| 6,198,142 B1 | 3/2001 | Chau et al. | |
| 6,294,823 B1 | 9/2001 | Arafa et al. | |
| 6,306,712 B1 | 10/2001 | Rodder et al. | |
| 6,313,510 B1 * | 11/2001 | Kim et al. | 257/382 |
| 6,372,589 B1 * | 4/2002 | Yu | 438/304 |
| 6,399,451 B1 * | 6/2002 | Lim et al. | 438/303 |
| 6,414,353 B2 * | 7/2002 | Maeda et al. | 257/347 |
| 6,429,083 B1 | 8/2002 | Ishida et al. | |
| 6,465,835 B1 * | 10/2002 | Pham et al. | 257/315 |
| 6,501,134 B1 * | 12/2002 | Krivokapic | 257/350 |
| 6,534,351 B2 * | 3/2003 | Muller et al. | 438/182 |
| 2002/0056873 A1 * | 5/2002 | Wann | 257/336 |
| 2002/0068410 A1 * | 6/2002 | Tseng et al. | 438/305 |
| 2002/0195686 A1 * | 12/2002 | Kim et al. | 257/621 |
| 2003/0008487 A1 * | 1/2003 | Iwai | 438/586 |

* cited by examiner

*Primary Examiner*—Amir Zarabian
*Assistant Examiner*—Ida M. Soward
(74) *Attorney, Agent, or Firm*—Blakely, Sokoloff, Taylor & Zafman LLP

(57) ABSTRACT

A transistor comprising a gate, a channel beneath the gate and separated from the gate by an insulator, a source adjacent to the channel on a first side of the gate, a drain adjacent to the channel on a second side of the gate, doped extension regions into the channel from the source and the drain that underlap the gate, and insulating spacers adjacent to sidewalls of the gate that overlap the extension regions. The insulating spacers may be used to align the doped extension regions, offset the extension regions from the gate, and reduce Miller capacitance and standby leakage current.

22 Claims, 13 Drawing Sheets

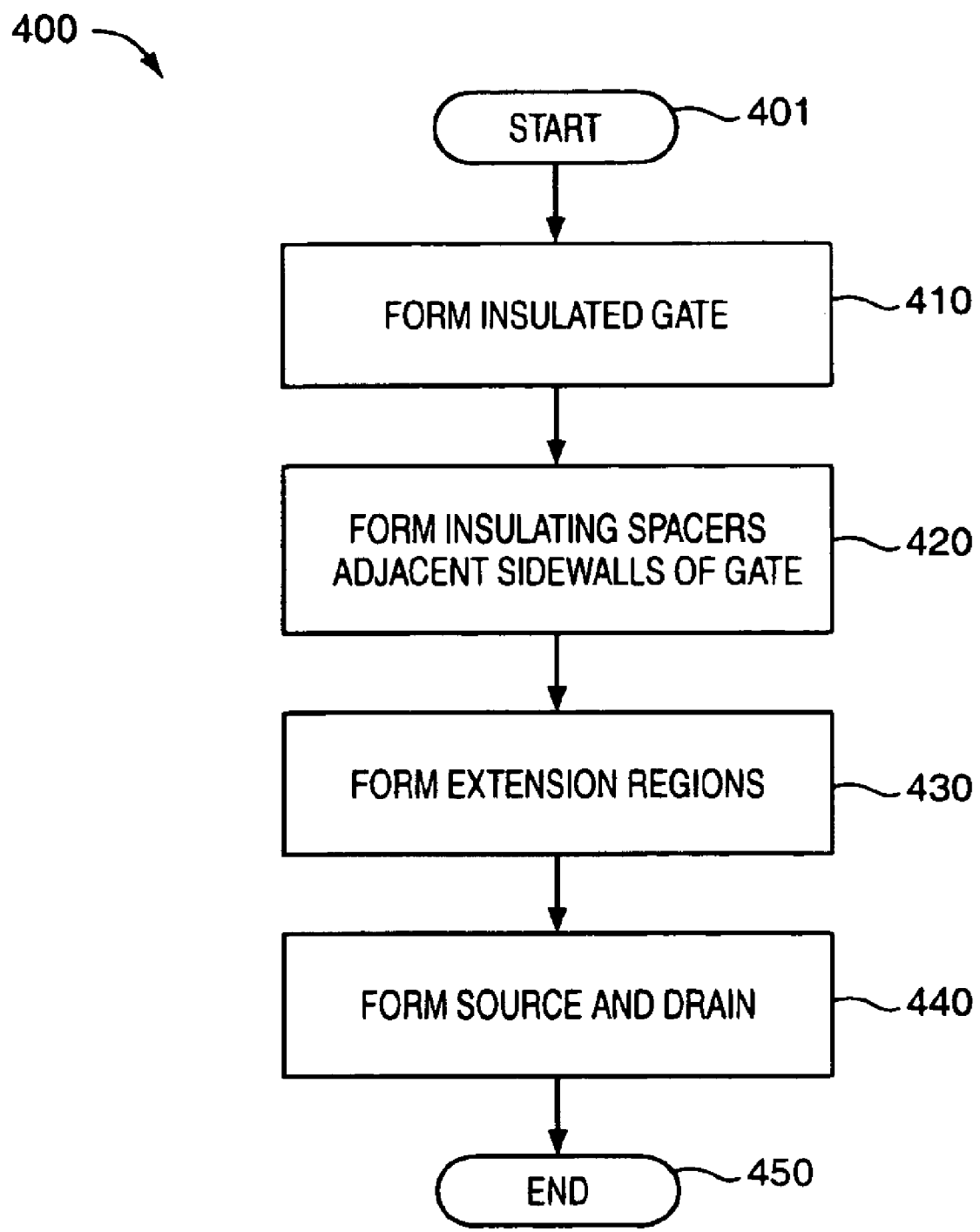

TRANSISTOR HAVING INSULATING SPACERS ON GATE SIDEWALLS TO REDUCE OVERLAP BETWEEN THE GATE AND DOPED EXTENSION REGIONS OF THE SOURCE AND DRAIN

BACKGROUND

1. Field

Embodiments of the present invention relate to semiconductor integrated circuits, and more particularly to field effect transistors, and methods for fabricating the transistors.

2. Background Information

A transistor is a semiconductor switching device that may be used to amplify a signal or open or close a circuit. Transistors are important building blocks, along with a few others such as resistors, capacitors, and diodes, to make up logic gates used to create integrated circuits for most electronic devices and computer systems. Modern day microprocessors for computer systems, for example, may contain tens of millions of microscopic transistors. Indeed, it is difficult to imagine that modern computing, as we now know it, would be possible without the use of transistors. Accordingly, the transistor may be regarded among the most significant, important, and valued inventions of the last century.

The inventors have discovered improved transistors and methods for fabricating those transistors. Prior to disclosing the transistors and methods a brief discussion of several prior art transistors may help to illustrate the significance of the developments disclosed herein.

FIG. 1 shows a cross section of a prior art insulated gate field effect transistor 100 having shallow doped extension regions 108A/B from a source 104A and a drain 104B into a channel 110 located beneath an insulated gate 106 such that the extension regions underlap the insulated gate. The transistor is disposed on a silicon substrate 102 and contains the source 104A, the drain 104B, the channel 110, the gate 106, the source extension region 108A from the source into the channel, the drain extension region 108B from the drain into the channel, a gate dielectric 112 to separate the gate from the channel, a source spacer 116A to offset the source from the gate, a source spacer liner 114A to separate the source spacer from the gate, a drain spacer 116B to offset the drain from the gate, and a drain spacer liner 114B to separate the drain spacer from the gate.

The extension regions 108A/B underlap the insulator 112 and the gate 106. The method of fabricating the transistor includes forming the gate dielectric 112 and the gate 106, then forming extension regions 108A/B typically by an ion implantation process that introduces the ions in alignment with the sidewalls of the gate, and then, after forming the extension regions, depositing the source/drain spacer liners 114A/B. Since the doped extension regions are created before the source/drain spacer liners, the location and length of the extension regions (and hence the amount of underlap with the gate) are determined by the sidewalls of the gate, rather than by the sidewalls of the source/drain spacer liners. The underlap may lead to operational problems for the transistor, such as parasitic Miller capacitance that may slow the switching speed of the transistor, and standby or off-state leakage currents.

One approach for reducing the amount of underlap involves forming notches at the base of the gate. FIG. 2 shows a cross-sectional view of a prior art transistor 101 that has notches 118A/B in a notched gate 107 to reduce the underlap of doped extension regions 108A/B with the gate 107. The notches reduce the width at the base of the gate while leaving the width at the top of the gate unaltered. The method of fabricating the transistor includes etching the notches 118A/B from the gate 107 and the gate dielectric 113, then doping extension regions 108A/B by an ion implantation process that introduces the ions at a position of the substrate 102 that is in a vertical line-of-sight alignment with the outermost upper edges of the notched gate, and then (after forming the extension regions) forming source/drain spacer liners 115A/B. The notches reduce the amount of overlap between the gate and the extension regions. Unfortunately, the etching of the notches is difficult to control and the size and shape of the notches may vary and cause variability in the operation of different transistors, which is generally undesirable. Additionally, the notches do not help reduce the width at the top of the notched gate and therefore do not improve the packing density of the transistors in integrated circuits.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 4 shows a method for fabricating a transistor having insulating spacers adjacent to sidewalls of a gate, according to embodiments of the invention.

DETAILED DESCRIPTION

Described herein are new and useful transistors having insulating spacers adjacent sidewalls of a gate in order to offset subsequently formed extension regions from the gate and allow a small amount of lap between the gate and the extension regions. In the following description, numerous specific details are set forth. However, it is understood that embodiments of the invention may be practiced without these specific details. For example, the concepts of the invention will be illustrated through a particular transistor structure, although will be apparent to a person having an ordinary level of skill in the transistor fabrication arts and the benefit of the present disclosure that the detailed structure is not a requirement of the invention and that the insulating spacers disclosed herein may be incorporated into numerous other well-known transistor structures, including those structures having different arrangements of the source, the drain, and the gate. As another example, particular materials and processes that are commonly used in the semiconductor processing arts are set forth in order to illustrate one transistor, although these particular materials and processes are not a requirement of the invention and may be replaced by others that are well-known in the arts. In other instances, well-known structures and techniques have not been shown in detail to avoid obscuring the understanding of this description.

I. Exemplary Transistor Having Insulating Sidewall Spacers

Figure 3:
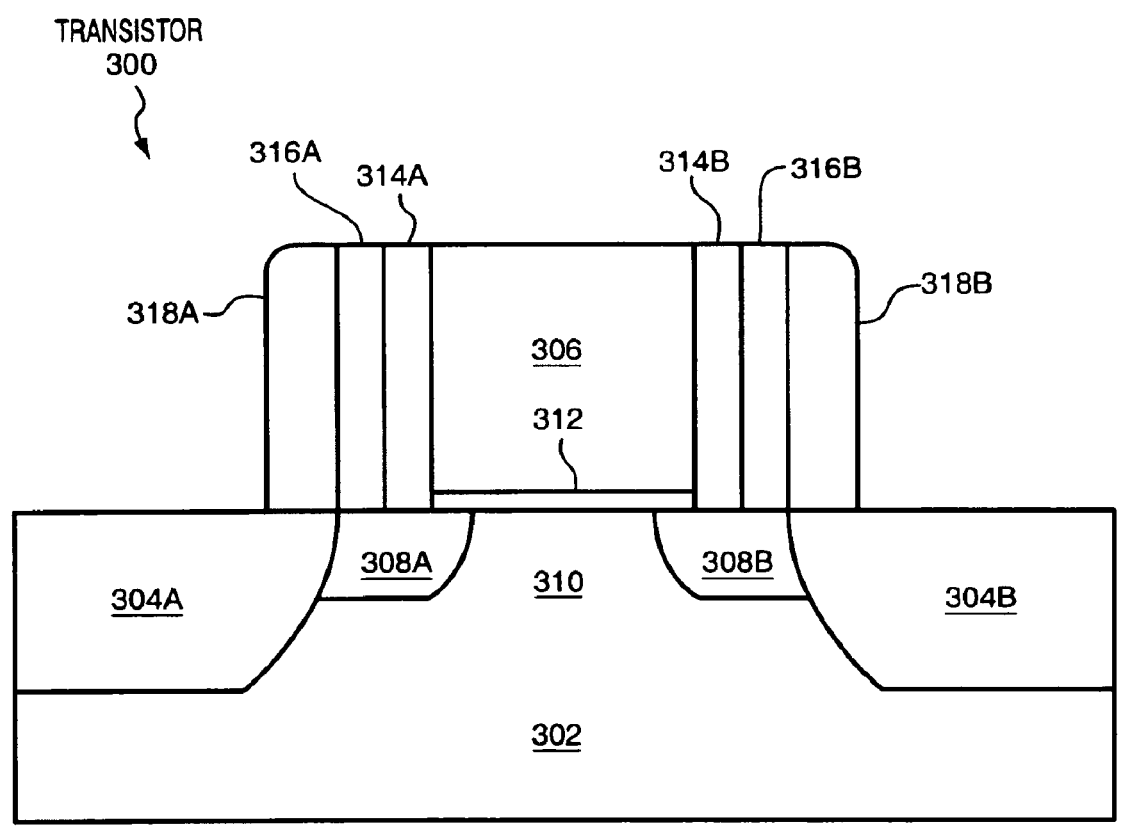
FIG. 3 shows a cross-sectional view of an insulated gate field effect transistor containing insulating spacers adjacent to sidewalls of a gate to offset source/drain extension regions from the gate and to allow a reduced amount of lap between the gate and the extension regions, according to embodiments of the invention.

FIG. 3 shows an insulated gate field effect transistor 300 having insulating spacers 314A/B adjacent and in this case abutting sidewalls of a gate terminal 306 to offset subsequently formed source/drain extension regions 308A/B from the gate and to allow a small and tailored amount of lap between the gate and the extension regions, according to embodiments of the invention. The transistor may offer a number of advantages over prior art transistors that lack the insulating spacers 314A/B including, among others, reduced Miller capacitance between the gate and the extension regions, which may allow the transistor to be switched faster than transistors that lack the insulating spacers, and reduced standby or off-state leakage currents (i.e., less current flows through transistor when it is in its standby or off-state) at the same gate length. This may make the transistor well suited for high frequency switching operations. As will be discussed in more detail below (see FIG. 6), the transistor may also allow reduced gate length for the same channel length, which may allow increased transistor packing density.

The transistor 300 includes the gate terminal 306, source and drain terminals 304A/B, the extension regions 308A/B, a channel 310 disposed between the extension regions, an insulator or gate dielectric 312 to separate the gate from the channel, the insulating spacers 314A/B adjacent and in this case abutting sidewalls of the gate (the insulating spacers are formed along the "width" of the gate into the page) to offset the extension regions from the gate, source/drain spacers 318A/B at right-hand and left-hand sides of the gate to offset the source/drain terminals from the gate, and source/drain spacer liners 316A/B disposed between and separating the source/drain spacers 318A/B and the insulating spacers 314A/B.

The transistor is formed on a substrate 302. The substrate represents a general workplace object having the transistor formed thereon often as part of an integrated circuit. The substrate is often a semiconductor substrate containing a semiconductor material. The preferred semiconductor material will often be silicon, in order to take advantage of the large amount of know-how and cost effectiveness of fabricating transistors from silicon, although this is not a requirement of the invention. Suitable silicon substrates include among others single crystal silicon, polycrystalline silicon and silicon on insulator (SOI). Of course, in alternate embodiments of the invention the silicon may potentially be replaced with other well-known elemental or compound semiconductors, such as germanium (Ge), a combination of elements from Group 4A (e.g., SiGe or SiC), a combination of elements from Groups 3A and 5A (e.g., gallium arsenide (GaAs), indium phosphate (InP), or gallium nitride (GaN)), or other well-known semiconductors.

The gate, source, and drain are each terminals of a three-terminal insulated gate field effect transistor (FET). Occasionally the terminals are referred to as junctions or electrodes. In the particular transistor illustrated, the source and the drain are provided at opposite ends of the channel so that the channel is disposed between the source and the drain. Conduction occurs through the channel between the extension regions of the source/drain terminals subsequent to an inversion of the semiconductor surface under the influence of an electric field resulting from a voltage applied to the gate terminal. In order to avoid obscuring the concepts of the invention, the insulating spacers are illustrated on a transistor with geometrically symmetrical source and drain terminals that differ mainly on the basis of the voltage that is to be applied to the terminals when the transistor is operated in a circuit. The terminal 304A may be the source and the terminal 304B may be the drain, or these terminals may be reversed. For convenience, in such a transistor, the symmetrical terminals will be referred to as source/drain terminals. Of course, the invention is also applicable to alternate transistors in which the source and drain terminals are asymmetrical.

The transistor may be fabricated from a number of materials that are commonly used in the semiconductor processing arts. Commonly the gate, the source, the drain, and the extension regions will each contain a conductive material. Exemplary conductive materials that are commonly used in the semiconductor processing arts include doped semiconductor materials, doped silicon (e.g., polycrystalline silicon or single crystal silicon), metals, and other conductors. The doped semiconductors contain semiconductors into which suitable dopants have been added in order to modify their electrical properties for example to make them conductive. Dopants that are commonly used for silicon include among others arsenic, boron, phosphorous and antimony. In one exemplary transistor, each of the source/drain, and gate terminals may contain doped semiconductor materials, and the source/drain terminals have a conductivity type, either p-type or n-type, which is opposite that of the substrate. Of course one or more of the gate, the source, and the drain may alternatively contain another conductive material such as a metal.

The transistor also contains extension regions 308A/B that extend from the main portion of the respective source/drain terminals toward the channel. The extension regions are occasionally known as tips. The extension regions may be regions of the substrate, shallower than the source/drain terminals, which contain conductive material, such as lightly doped semiconductor material that extends underneath the insulating spacers 314A/B and a portion of the insulated gate. The extension regions often have a length that is sufficient to separate the end of the extension region nearest the gate from the source/drain terminals so that the extension regions nearest the gate are not overwhelmed by the subsequent heavy and deep doping of the source/drain terminals. In one particular instance the depth of the extension regions is approximately 0.03 micrometers (a micrometer is one millionth of a meter) and the length is slightly less than 0.03 micrometers, although this is not required. The extension regions are commonly formed by ion implantation and as an aspect of one embodiment of the invention are substantially in alignment with the outermost edges of the insulating sidewall spacers. The channel is an active region or body terminal between the extension regions and connecting the source/drain terminals in the field effect transistor. The channel often contains a semiconductor material that may or may not be doped. The conductivity of the channel is controlled or adjusted based on the voltage applied to the gate. The distance in the channel between the extension regions is referred to as the channel length and significantly impacts the operation of the transistor.

The insulator 312 separates the gate from the channel and from portions of the extension regions that underlap the gate. The insulator contains an insulating or dielectric material that resists flow of electrical current and has a sufficient thickness to provide a high resistance between the gate and the channel such that essentially no current flows between the gate and the channel and such that the gate and the channel are capacitively coupled. The insulator often contains a semiconductor oxide, such as an oxide of silicon (e.g., silicon dioxide, $SiO_2$) in the case of a silicon substrate. The oxide of silicon may be grown on the substrate or deposited, as desired. Alternatively, the insulator may contain a high dielectric constant (high-k) material that has a higher dielectric constant than that of silicon dioxide (i.e., higher than about 4.0). The high-k material may allow the same charge induced in the channel under the gate to be achieved at the same gate voltage in a thicker layer. That is, the higher dielectric constant may allow the insulator to have a greater layer thickness than a corresponding layer of silicon dioxide that provides the same amount of insulation. Such thicker layers may provide reduced leakage current compared to a thinner layer of silicon dioxide.

The overlap between the gate 306 and the extension regions 308A/B through the insulator 312 often leads to parasitic capacitance that slows the switching speed of the transistor or the amount of time associated with turning the transistor from an "off" state to an "on" state, or from an "on" state to an "off" state. The conductive materials of the gate and the extension regions 308A/B, separated by the insulator 312, represent charge accumulative or capacitive structures that have an ability to store charge. Between switching cycles the gate and the extension regions may become energized with an internal separation of charge in the proximity of the overlap regions. Voltages applied to the gate tend to attract charges in the extension regions. For example, when the transistor gate is positively biased, electrons from the extension regions and the channel may be attracted toward the gate. The amount of capacitance and charge separation will often be directly related to the area of overlap that is shared between the gate and the extension regions and inversely related to both the thickness and dielectric constant of the gate insulator. Accordingly, more charge may be accumulated when there is more overlap. In insulated gate field effect transistors, this capacitance is often referred to as Miller capacitance, overlap capacitance, or simply parasitic capacitance.

In order to switch the transistor, the capacitive structures need to be de-energized by discharging the accumulated charges. Generally, the time to de-energize the capacitive structures, and to switch the transistor, depend directly upon the amount of charge that is accumulated (i.e., upon the capacitance) and hence the amount of overlap. Accordingly, the time to discharge the capacitive structures, and also the time to switch the transistor, may both be decreased by reducing the overlap of the gate and the extension regions (the capacitive area).

The inventors have discovered that insulating spacers 314A/B may be used to offset the subsequently formed extension regions 308A/B from the gate 306 and thereby reduce the amount of lap between the gate and the extension regions. The offset and lap depend upon the thickness of the insulating spacers. The amount of overlap between the extension regions and the gate varies for different generations and uses of transistors and is not easy to measure accurately in practice. Often, rather than measuring the amount of overlap directly, the Miller capacitance is measured as an indication of the amount of overlap. Although the amount of Miller capacitance may depend upon the design and use of the transistor and upon the amount of effort to reduce the Miller capacitance by modifying the extension implant conditions, the channel doping conditions, and the thermal conditions to which the doped regions are exposed (e.g., the anneal), for deep sub-micron transistors, in which the dimensions are less than approximately 0.5 micrometers, the Miller capacitance without the insulating spacers may often be in the range of approximately 0.6–0.8 fF/um, perhaps slightly less or more depending upon the transistor design and upon what if any efforts are taken to reduce the capacitance.

The insulating spacers may be used, potentially in combination with other known approaches, to reduce the Miller capacitance in a transistor by offsetting the extension regions and reducing the shared lap between the extension regions and the gate. In embodiments of the invention, the insulating spacers may have a thickness in the range of approximately 10–200 Angstroms (an Angstrom is 1/10,000,000,000 of a meter), or approximately 20–100 Angstroms. Thicker insulating spacers may be used in transistors that have more overlap (or Miller capacitance) and thinner insulating spacers may be used in transistors that have less overlap. Likewise, a thinner insulating spacer may be used if a smaller reduction in Miller capacitance is desired, and a thicker insulating spacer may be used if a larger reduction in Miller capacitance is desired, although at some large thickness it may become difficult to form the transistor effectively. Additionally, it will be appreciated that as the dimensions of transistors are reduced through the application of more advanced processing techniques the thickness of the insulating spacers may be similarly reduced. For example, it is contemplated that in shorter channel length transistors that insulating spacers of thickness, not greater than approximately 100, 50, or 20 Angstroms may be desired.

Experiments by the inventors indicate that such insulating spacers may help reduce the Miller capacitance by an effective amount up to approximately 50%. Even larger reductions may be achieved in transistors having a higher starting Miller capacitance without the insulating spacers (e.g., higher than approximately 0.8 fF/um). It is contemplated that employing the insulating spacers in a 0.25 micron technology transistor may be used to reduce the Miller capacitance to less than approximately 0.4 fF/um. These reductions in Miller capacitance may be realized without the need to form notches in the gate, such as those shown in FIG. 2, which are known to be problematic to control.

The insulating sidewall spacers may also be used to reduce the standby leakage current or increase the transistor packing density. At the same gate length, the insulating spacers may help reduce the standby leakage current by increasing the effective channel length. Alternatively, at the same channel length, the insulating spacers may allow reduced gate lengths that may allow increased transistor packing within an integrated circuit. This is discussed in more detail in FIG. 6.

A variety of materials may be used for the insulating spacers. The material should be sufficiently insulating or dielectric to prevent substantial flow of current between the extension regions and the gate through the insulating spacers. Also, the material should provide good contact, adhesion and stability in contact and adhesion to the gate, the extension regions, and any other materials it may contact (e.g., the source/drain spacer liners 316A/B) in order to avoid delamination, blistering, and the like. The stability may depend upon such parameters as coefficient of thermal expansion. With these considerations in mind, in one embodiment of the invention, the spacers may contain an oxide of silicon (e.g., silicon dioxide). Silicon dioxide is sufficiently dielectric and provides good contact and adhesion to silicon (which may be used for the gate extension regions) as well as such others materials as silicon nitride and silicon oxynitride. The silicon dioxide may be, formed by chemical vapor deposition (CVD), physical vapor deposition (PVD), or by growth through an oxidation of silicon followed by an anisotropic etch or other method of removal. Deposition may be favored for the formation of thicker insulating spacers.

Alternatively, other materials that are well known in the semiconductor processing arts may be used for the insulating spacers. Potentially any known formation or deposition process for forming insulating or dielectric material along the sidewalls of the gate relatively conformally and controllably to the underlying topography may be used. Exemplary materials include, among others, mixed oxides of silicon, silicon oxynitride (e.g., $SiO_xN_y$)), nitrides of silicon (e.g., silicon nitride, SiN), various metal oxides (e.g., hafnium oxide ($HfO_2$), zirconium oxide ($ZrO_2$), tantalum oxide ($Ta_2O_5$), low dielectric constant materials, organic materials, and other dielectric materials deposited by conventional CVD or PVD processes (e.g., evaporation, sputtering).

The particular transistor shown contains source/drain spacers 318A/B and source/drain spacer liners 316A/B, although this is not a requirement of the invention. Practitioners will often desire to include the source/drain spacers in order to offset the subsequently formed doped source/drain terminals from the gate and from the extension regions. The offset provided by the source/drain spacers may help to avoid overwhelming and altering the extension and channel regions during high energy and dose doping of the source/drain terminals. When the spacers are desired it may also be desirable to include the liners 316A/B for example to provide good contact, adhesion and material compatibility between the spacers 318A/B and 314A/B, to serve as an etch stop layer for the formation of the spacers 318A/B, or both.

II. Method for Fabricating a Transistor Having Insulating Spacers

FIG. 4 shows a method 400 for fabricating a transistor having insulating spacers adjacent gate sidewalls, according to embodiments of the invention. After starting at block 401 an insulated gate is formed on a substrate at block 410. This may include forming a silicon gate electrode on a silicon dioxide gate dielectric on a surface of a semiconductor substrate. Then at block 420 a pair of insulating spacers is formed adjacent to the sidewalls of the gate on opposite sides thereof. In one embodiment of the invention, the insulating spacers may be formed by blanket depositing a layer of insulating material over the insulated gate and then selectively removing portions of the layer that are not on the sidewalls of the gate for example with an anisotropic etch. For example, a silicon dioxide layer may be deposited by CVD, and then a substantially anisotropic etch, with a preference for removing material in a direction parallel to the sidewalls, may be used to selectively remove portions of the layer that are not adjacent to the sidewalls. In an alternate embodiment of the invention, the silicon dioxide layer may be formed by oxidative growth, as is common in the semiconductor processing arts, and then an etch may be used to form the insulating spacers.

After forming the insulating spacers, extension regions may be formed in the substrate adjacent to the insulating spacers at block 430. Doped extension regions may be formed by an ion implantation process in which the insulating spacers are used to align the dopants introduced into the substrate. Next, a source and a drain are formed at block 440. This may include performing a thermal anneal to electrically activate the source/drain terminals, as well as the doped extension regions. The method for fabricating the transistor terminates at block 450, although it will be appreciated that other conventional operations will often be performed, for example to form contacts to the terminals of the transistor.

III. Exemplary Method For Fabricating a Transistor Having Insulating Spacers

Figure 5A:
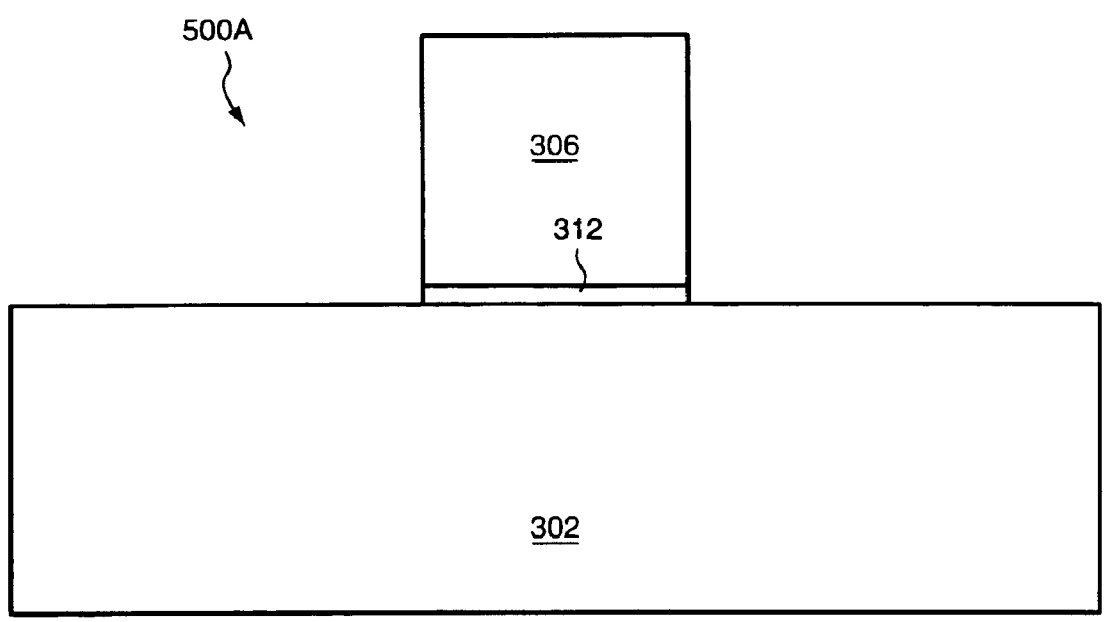
FIG. 5A shows a cross-sectional view of a first intermediate transistor structure containing an insulated gate including a gate dielectric and a gate terminal formed on a substrate, according to embodiments of the invention.
Figure 5B:
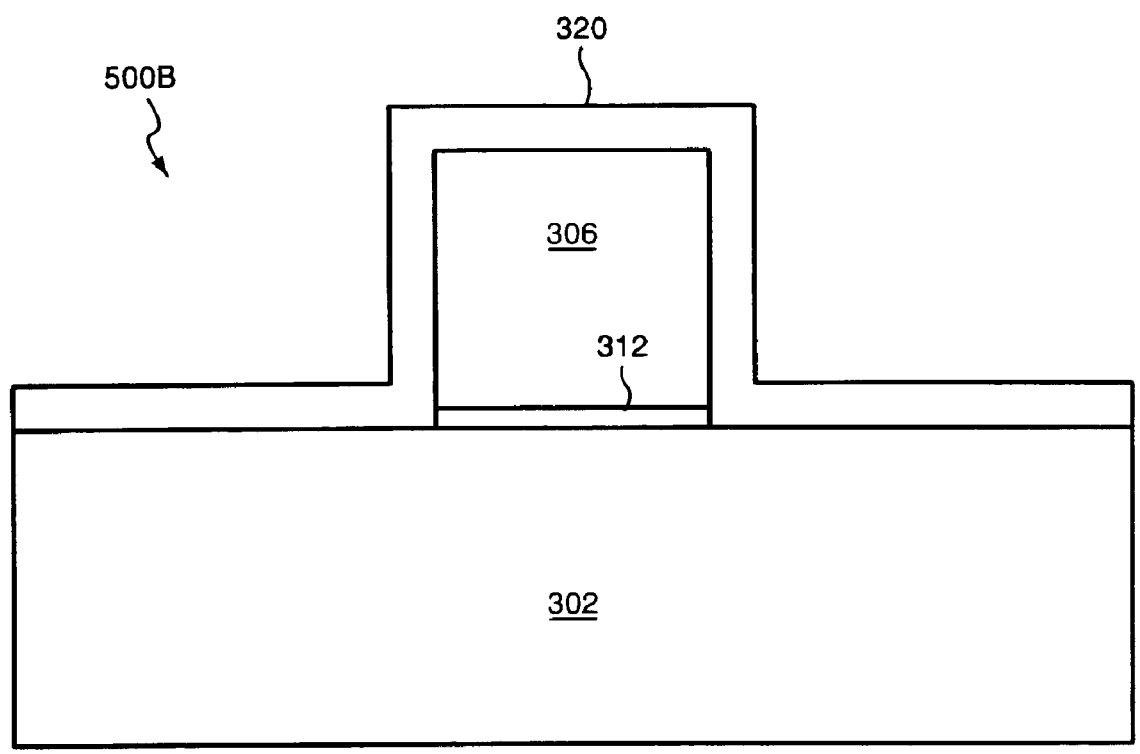
FIG. 5B shows a cross-sectional view of a second intermediate transistor structure containing an insulating layer formed over the insulated gate and substrate of FIG. 5A, according to embodiments of the invention.
Figure 5C:
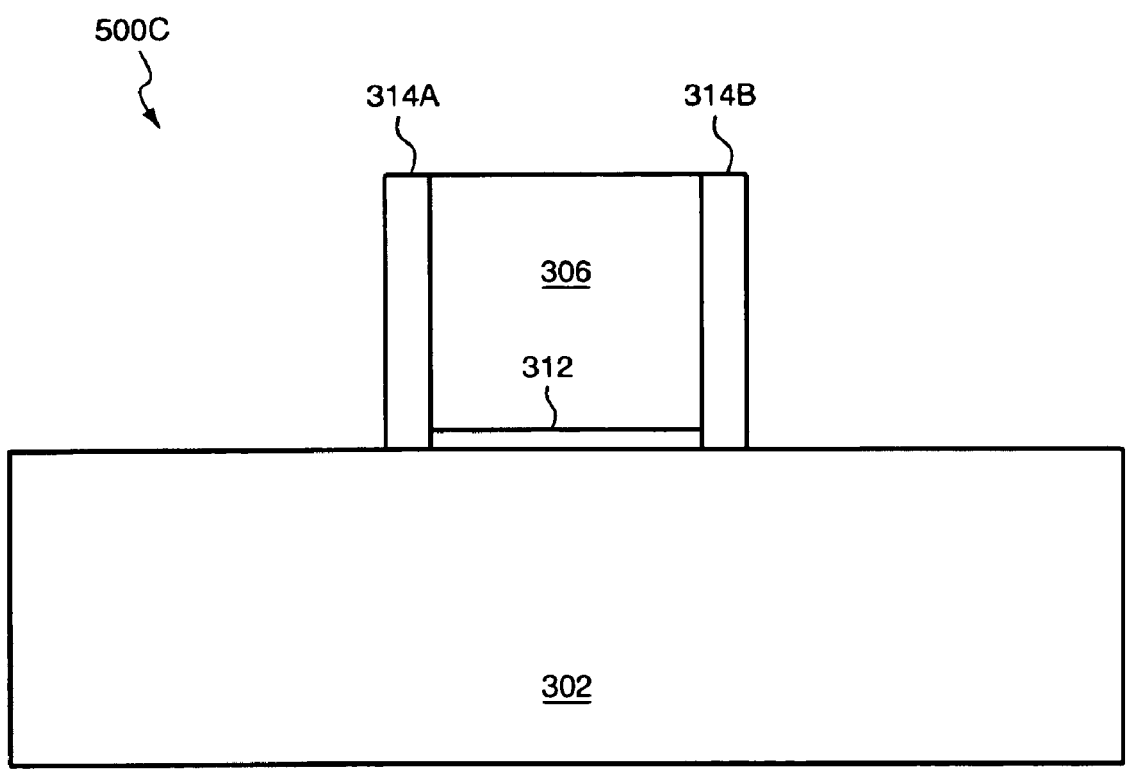
FIG. 5C shows a cross-sectional view of a third intermediate transistor structure containing insulating sidewall spacers formed by removing portions of the insulating layer of FIG. 5B that are not on the sidewalls of the insulated gate, according to embodiments of the invention.
Figure 5D:
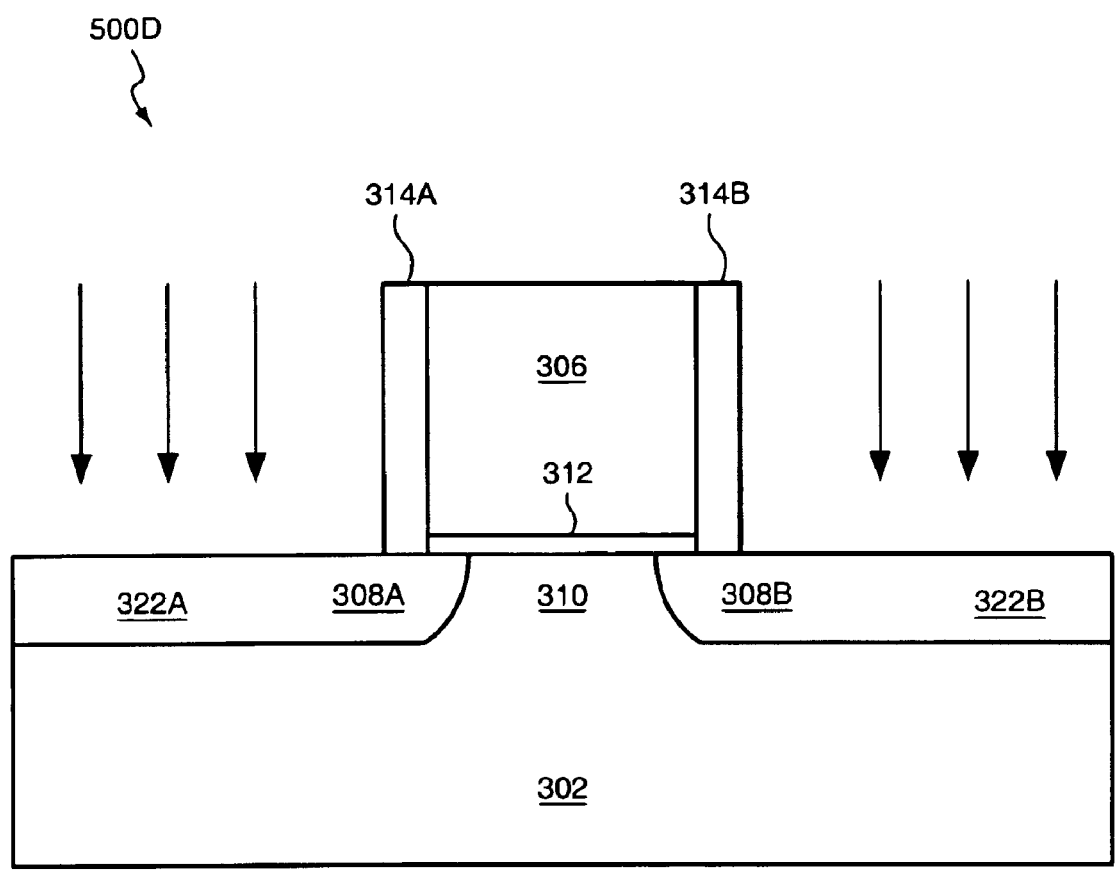
FIG. 5D shows a cross-sectional view of a fourth intermediate transistor structure containing doped extension regions formed in the substrate at opposite sides of the insulated gate by using the insulating spacers of FIG. 5C for alignment, according to embodiments of the invention.
Figure 5E:
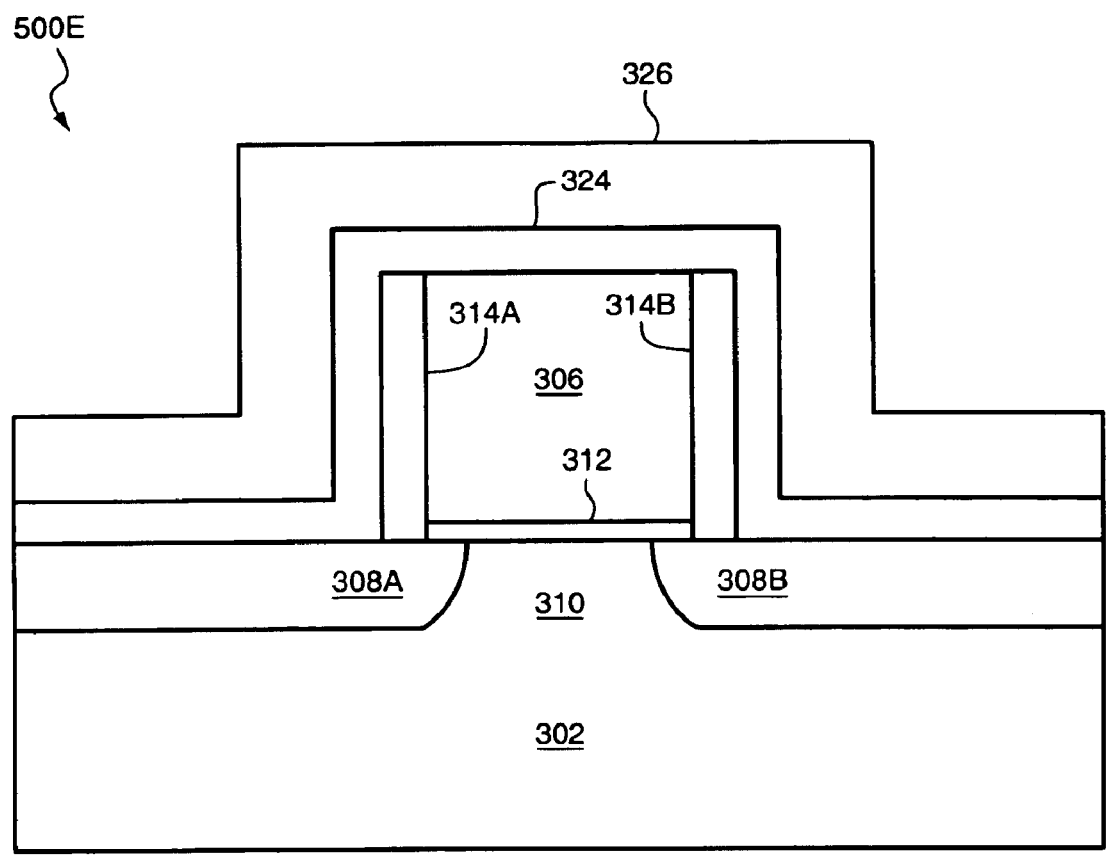
FIG. 5E shows a cross-sectional view of a fifth intermediate transistor structure containing an optional insulating liner layer formed over the substrate, the insulating spacers, and the top of the insulated gate of FIG. 5D, and containing an optional insulating spacer layer formed over the liner layer, according to embodiments of the invention.
Figure 5F:
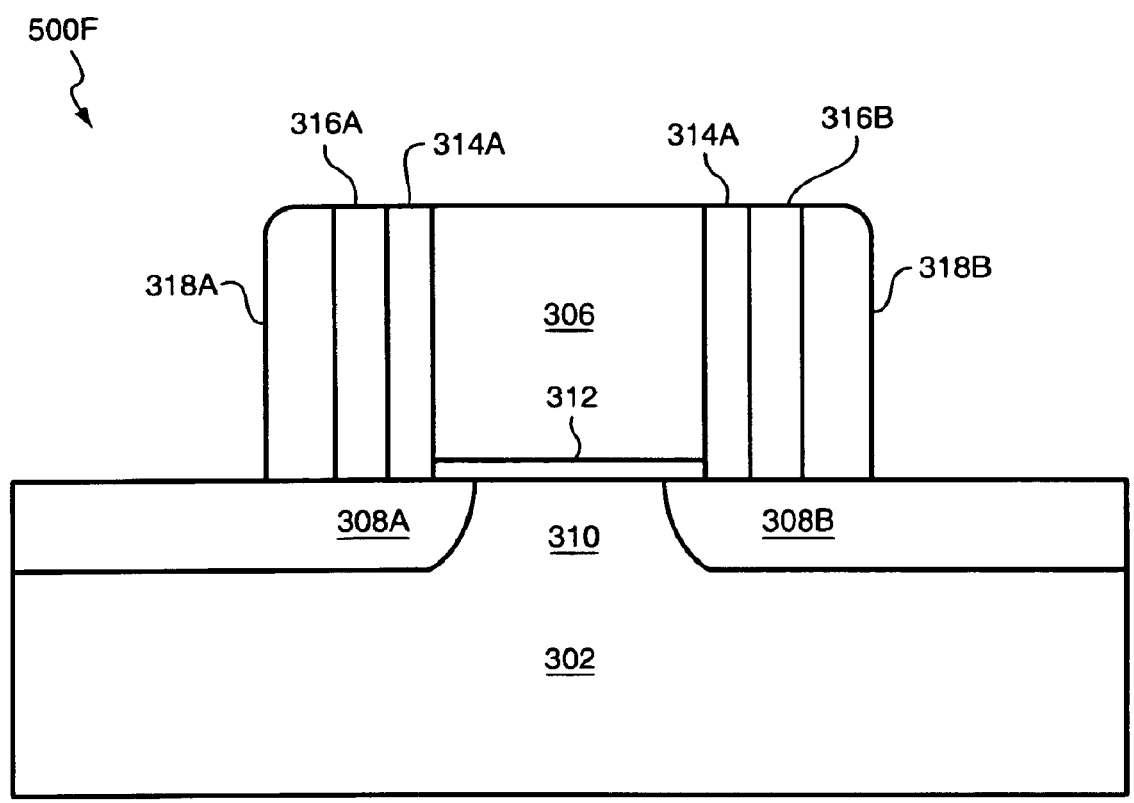
FIG. 5F shows a cross-sectional view of a sixth intermediate transistor structure containing liners and source/drain spacers at the left-hand and right-hand sides of the gate formed by removing portions of the insulating liner layer and insulating spacer layer of FIG. 5E, according to embodiments of the invention.
Figure 5G:
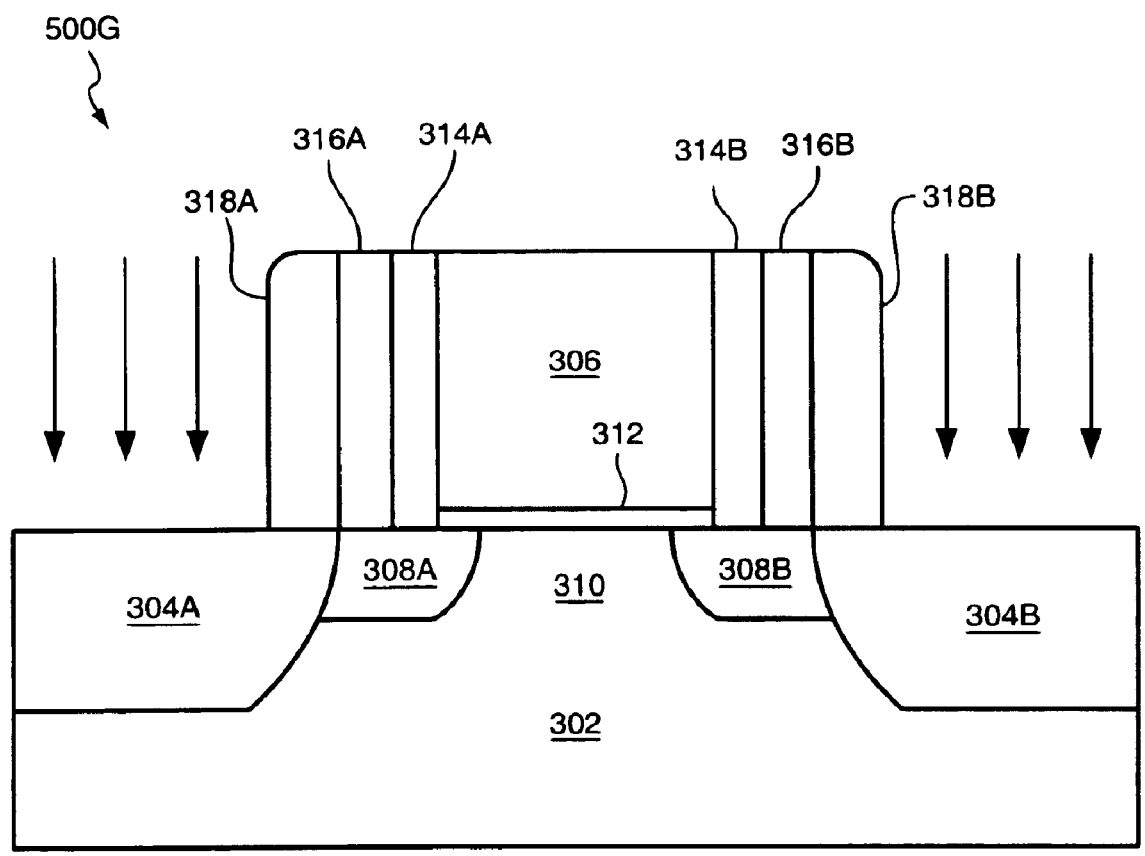
FIG. 5G shows a cross-sectional view of a seventh intermediate transistor structure containing doped source/drain terminals formed in the substrate at opposite sides of the insulated gate by using the source/drain spacers of FIG. 5F for alignment, according to embodiments of the invention.

FIGS. 5A–I show cross-sectional views of intermediate transistor structures representing different stages of a method for fabricating the transistor shown in FIG. 5G having insulating sidewall spacers attached to the gate to offset extension regions from the gate, according to embodiments of the invention. In these embodiments, an insulated gate terminal is formed as shown in FIG. 5A, the insulating spacers are formed on the sidewalls of the gate as shown in FIGS. 5B–5C, the extension regions are formed subsequently to the formation of the insulating spacers as shown in FIG. 5D, and the source/drain terminals are formed as shown in FIGS. 5E–5G.

FIG. 5A shows a cross-sectional view of a first intermediate transistor structure 500A containing an insulated gate including an insulator (a gate dielectric) 312 and a gate terminal 306 formed on a substrate 302. The gate dielectric and gate may be formed on the substrate by techniques that are well known in the semiconductor processing arts. For example, a layer of a dielectric material may be formed on the substrate, next a layer of a conductive gate material may be formed over the dielectric layer, and then the layers may be lithographically patterned and etched to form the gate and the gate dielectric. Often, the dielectric layer may contain silicon dioxide that is formed by either wet or dry oxidative growth from exposed silicon of the substrate, although this is not required, and the layer may also be deposited, or otherwise formed. The silicon dioxide layer commonly has a thickness in the range of approximately 10–200 Angstroms. Alternatively, the insulator 312 may be formed of a high dielectric constant or other material. Next, a layer of conductive gate material may be formed over the dielectric layer. Often, a polycrystalline silicon layer may be deposited by CVD to a thickness in the range of approximately 1000–3500 Angstroms. The gate may also be formed from metals or other materials capable of exhibiting conductive properties. Finally, the layers may be lithographically patterned and etched to form the gate and the gate dielectric.

FIGS. 5B–5C show forming insulating spacers adjacent to the sidewalls of a gate, according to embodiments of the invention, in which an insulating layer is formed over the gate and an anisotropic etch is used to selectively remove some of the material and to form or carve the insulating spacers from the insulating layer. In particular, FIG. 5B shows a cross-sectional view of a second intermediate transistor structure 500B containing an insulating layer 320 formed over the insulated gate and substrate of FIG. 5A. The insulating layer is formed on the sidewalls of the gate so that the insulating spacers formed from this layer will abut the sidewalls of the gate, although this is not required, and it is contemplated that in other transistors one or more layers may be disposed between the insulating layer and the gate sidewalls. In some embodiments of the invention, the insulating layer is formed by deposition of an insulating or dielectric material and in other embodiments the insulating layer may be formed by growth of an oxide of an underlying material.

In the embodiments of the invention where an insulating layer is deposited, the layer may be deposited by CVD, PVD, or other suitable techniques (e.g., atomic layer deposition (ALD)). CVD and PVD are widely used in the semiconductor processing arts and are regarded to be well-known techniques. Exemplary materials that may be deposited by one or more of CVD and PVD include, but are not limited to, oxides of silicon, nitrides of silicon, oxynitrides of silicon, doped oxide of silicon glasses (e.g., phosphosilicate glass, borophosphosilicate glass, fluorosilicate glass, metal oxides (e.g., aluminum oxide, hafnium oxide, etc.), high dielectric constant materials, low dielectric constant materials, and numerous other conventional dielectric materials that are commonly used in the semiconductor processing arts. It will be appreciated by a person having an ordinary level of skill in the semiconductor processing arts that there are many different variations on the methods and materials that may be used to form the insulating layers by CVD or PVD.

In one particular embodiment of the invention, a layer of silicon dioxide may be deposited by CVD. Silicon dioxide provides good dielectric properties, and good contact, adhesion, and stability in contact and adhesion to silicon (which is a common material used for the gate). Numerous different types of CVD are suitable including but not limited to low pressure CVD (LPCVD), plasma assisted CVD (e.g., either plasma enhanced CVD (PECVD) or high-density plasma CVD (HDPCVD)), and atmospheric pressure CVD (APCVD). These are conventional and well-known techniques. High quality dielectric layers that are homogeneous and have low levels of impurities may be desired in some embodiments including those where the high quality dielectric layer may be used to provide sufficient charge retention in Flash, EEPROM (Electronically Erasable Programmable Read Only Memory), or other PROM transistors containing floating gates that are formed on the same integrated circuit as the present transistor. LPCVD may be desired over PECVD, HDPCVD, and APCVD inasmuch as LPCVD may provide higher quality and more conformal layers than these other techniques. Numerous conventional LPCVD chemistries and conditions may be used. As desired, the deposition method may include high-temperature depositions, such as temperatures higher than approximately 750° C., which would typically diffuse and disturb doped extension regions, if they existed, which they do not in the present transistor. Such depositions by CVD will often be desired for the ability to form high quality and substantially conformal and uniform thickness layers. Of course the insulating layer formed by LPCVD may not be perfectly conformal and uniform. In particular, the layer along the sidewalls may be slightly thicker at the top of the gate than at the bottom of the gate. In such case the thickness at the top of the gate may primarily determine the overlap between the gate and the extension regions, since the outer edge of the insulating spacer at the top of the gate may act as the ion implantation alignment mask for formation of the doped extension regions. Also, the layers on the top surface of the gate may also be slightly thicker than the layers on the sidewalls.

In other embodiments of the invention, a silicon dioxide layer may be deposited by PVD, for example by sputtering or evaporation. Alternatively, a silicon nitride layer may be deposited by CVD, LPCVD, PVD, sputtering, or evaporation. Alternatively, many other metal oxides, low dielectric constant materials, or high dielectric constant materials may be deposited by CVD, LPCVD, PVD, sputtering, evaporation, or other deposition techniques commonly used in the semiconductor processing arts.

Alternatively, in some embodiments of the invention, the insulating layer may be formed by growth or conversion of an underlying material of the gate. For example, in the case of a silicon gate, an oxide of silicon may be grown over the gate. Silicon at or near exposed surfaces of the gate and the substrate may be exposed to oxygen at a sufficiently high temperature in order to induce a reaction between the silicon and the oxygen and grow an oxide of the silicon (e.g., silicon dioxide). In such an embodiment, the width of the gate may effectively shrink by twice the width that is desired for the insulating layer. The growth of the oxide may slightly recess the extension regions away from the bottom corners of the gate. This approach may not be desirable for very high performance transistors with thick insulating spacers, due to the amount of recess created, although in other transistors the approach may be appropriate.

FIG. 5C shows a cross-sectional view of a third intermediate transistor structure 500C containing insulating sidewall spacers 314A/B formed by removing portions of the insulating layer 320 of FIG. 5B that are not on the sidewalls of the insulated gate, according to embodiments of the invention. The sidewall spacers are formed by removing portions of the insulating layer on the top of the gate and on the substrate at right-hand and left-hand sides of the insulating spacers. One approach for removing these portions is an anisotropic etch, such as a reactive ion etch, in which the etch rate or extent in the direction parallel to the sidewalls is significantly higher than or preferential to that in the direction perpendicular or normal to the sidewalls.

Suitable anisotropic etches include various dry etches that expose the layer to a reactive ion plasma that interacts chemically and/or physically with the layer to achieve removal. Dry etches are commonly used in the semiconductor processing arts in part because they provide good anisotrophy and critical dimension control. The dry etch may be performed in a high-density plasma etcher in order to obtain a highly anisotropic etch. The high-density plasma etcher is used to generate a sufficient number of ions to obtain the desired etch rate, which may be slow or fast depending upon the desired amount of anisotropy and endpoint control, at a relatively low pressure to reduce collisions between ions that could lead to increased etching of insulating layer on the sidewalls of the gate. The dry etch may be able to carve the insulating sidewall spacers from the insulating layer with a loss from the sidewalls that is usually only a few Angstroms. Extra material may be deposited or otherwise formed on the sidewall to accommodate for such losses, as desired. In a case where the insulating layer contains an oxide of silicon, a fluorocarbon chemistry may be used for the etch, although this is not required. One non-limiting example of etch involves utilizing a chemistry comprising $C_2F_6$ and a power in the range of approximately 50–500 Watts. Exemplary high-density plasma etchers used in the arts include electron cyclotron resonance, inductively coupled plasma, dual plasma source, and magnetically enhanced reactive ion etch. Of course, other dry etchers such as a barrel plasma etcher and others may also be used.

Endpoint detection for the etch may include optical emission spectroscopy to measure the etched material or other approaches that are commonly used in the semiconductor processing arts. Accurate endpoint detection may help avoid etching more than a few Angstroms into the substrate and creating recesses in the substrate at the edge of the spacer layers that may affect the performance of the extension regions. In one embodiment of the invention, if the dry etch does not have a sufficient selectivity and begins to etch the underlying substrate the dry etch may be stopped before complete etching of the overlying layer from which the insulating sidewall spacers are carved and a subsequent isotropic wet etch may be used to remove the remainder of the overlying layer and tailor the insulating sidewall spacers to the desired thickness. Of course this is not required and the dry etch may be used alone in an implementation that provides sufficient endpoint control.

The final width of the insulating sidewall spacers after etch-back is less than or perhaps substantially equal to, but related to, the total thickness of the insulating layer from which the sidewall spacers are formed. The width of the sidewall spacers may additionally depend upon the uniformity of the width of the insulating layer, the amount of overetch (if any) during the etch process, and the isotropic component of the substantially anisotropic etch. With these considerations in mind the desired width of the insulating sidewall spacers may be obtained by forming a layer with a particular thickness and by performing the etch with appropriately selected parameters. According to one embodiment of the invention, the final thickness of the insulating sidewall spacers may be in the range of approximately 10–200 Angstroms. If an anisotropic etch with high directional preference is used, the blanket insulating layer may have approximately this same thickness, or perhaps slightly more, for example having a plurality of additional Angstroms to allow for some isotropy.

The insulating spacers may also be formed by different approaches than the various approaches that have been shown and described in regards to FIGS. 5B–5C. For example, it is contemplated that an insulating material may be anisotropic or directional deposited on the sidewalls of the gate without needing to perform an etch. Anisotropic depositions of dielectric materials and silicon dioxide are known, see e.g., U.S. Pat. Nos. 5,302,555 and 5,013,691, and may potentially be used for this purpose. Additionally, it is contemplated that the insulating sidewall spacers may be removed, for example by a wet etch, after doping the extension regions by using the outer edges of the insulating spacers for alignment of the introduced ions. Removal of the sidewall spacers is presently not favored due to the addition of extra processing operations and to potential reduction in manufacturing yields due in part to etching of the gate dielectric.

FIG. 5D shows a cross-sectional view of a fourth intermediate transistor structure 500D containing doped extension regions 322A/B formed in the substrate 302 at opposite sides of the insulated gate in alignment with the insulating spacers 314A/B of FIG. 5C, according to embodiments of the invention. The doped regions will often be formed by ion implantation, as is common in the transistor fabrication arts, although they may also be formed by diffusion. Ion implantation usually provides better control over the doping concentration and depth of the doping profile than diffusion. During an ion implantation the dopant ions are introduced into the substrate with a dose, in atoms per area, that is suitable to provide the desired concentration and an implantation energy that is suitable to provide the desired depth. The outer edges of the insulating spacers may be used as an implant mask to align the doped regions and offset the doped regions from the gate with a spacing that depends upon the thickness of the insulating spacers.

FIGS. 5E–5G show forming a source and a drain, according to embodiments of the invention, in which source/drain spacers 318A/B are used to offset doped source/drain terminals from the extension regions and the gate. Practitioners will often desire to include the spacers 318A/B when the transistor is to contain doped source/drain terminals in order to help offset and protect the doped extension regions from alteration during the heavy and deep ion implantation that is often used to form the doped source/drain terminals, although this is not required. The spacers may be avoided either by employing greater control over the doping process, or if the expected amount of alteration of the extension regions is acceptable for the particular implementation. Additionally, the spacers 318A/B may be avoided in transistors that do not contain doped source/drain terminals (e.g., they contain metal source/drain terminals). In an embodiment of the invention wherein the spacers 318A/B are desired, it will often be desirably to additionally include source/drain spacer liners 316A/B disposed between the source/drain spacers 318A/B and the insulating spacers 314A/B, although the liners are optional. The liners may improve adhesiveness between the source/drain spacers and the insulating spacers, may protect and seal the gate or gate dielectric, and/or may serve as an etch stop for a subsequent etch to form the source/drain spacers and thereby help protect the underlying materials.

Returning now to FIG. 5E, it shows a cross-sectional view of a fifth intermediate transistor structure 500E containing an insulating liner layer 324 formed over a region of the substrate containing the insulated gate of FIG. 5D, over (and in this particular case on) the insulating spacers, and over the top of the insulated gate. The liner layer may be formed of a number of materials that are commonly used in the semiconductor processing arts and that are consistent with its intended operation as one or more of an insulating (dielectric) layer, an etch stop, and as a compatible material between the underlying materials and the overlying materials. Suitable materials include among others an oxide of silicon, an oxynitride of silicon, a nitride of silicon, various metal oxides, or other materials that are commonly used in the semiconductor processing arts.

The liner layer may be formed by CVD, PVD (e.g., sputtering, evaporation), and other known deposition techniques. One exemplary liner layer contains an oxide of silicon deposited by a low temperature CVD (e.g., PECVD) that creates temperatures in the substrate that are not greater than about 750° C. to avoid significant diffusion within the doped extension regions. Liners formed from such a layer may serve as an etch stop for a silicon nitride spacer etch and may be compatible with silicon, oxides of silicon, nitrides of silicon, and oxynitrides of silicon, and other materials that may be used for the insulating spacers 314A/B and the source/drain spacers 318A/B. Alternatively, a higher quality liner layer may be formed, for example by a for example by a LPCVD process, if higher temperatures not greater than about 900° C. are acceptable. Different thickness of the liner layer may be suitable for different implementations of the invention and different uses of the liner layer. Often the liner layer may have a thickness in the range of approximately 10–300 Angstroms, although this is not required. A thicker layer may be desired if the source/drain spacer etch is less selective, or if a thinner spacer layer is desired. Often, the liner layer will be thinner than the overlying spacer layer.

FIG. 5E also shows an insulating spacer layer 326 formed over the insulating liner layer 324. The source/drain spacers 318A/B may be formed from the insulating spacer layer 326 as discussed further below. The spacer layer may be formed by a number of deposition techniques that are commonly used in the semiconductor processing arts including but not limited to CVD and PVD. The spacer layer may be formed of a number of materials that are commonly used in the semiconductor processing arts. Often the spacer layer will be formed of an insulating or dielectric material that is compatible with underlying materials and any overlying materials (of which there are none in the present example). One particular spacer layer comprises a nitride of silicon deposited by a low temperature CVD, for example a PECVD, to avoid diffusion within the doped extension regions. Such a layer may be etched selectively relative to an oxide of silicon and may help to hermetically seal the gate and gate dielectric to promote electrical stability of the transistor. Alternatively, the spacer layer may comprise an oxynitride of silicon, an oxide of silicon, various metal oxides, or other materials that are commonly used in the semiconductor processing arts and that are consistent with the intended uses of the source/drain spacers 318A/B. The spacer layer 326 commonly provides a majority of the bulk that is used to space the source/drain terminals from the extension regions, although varying proportions of this bulk may be made up by the liner layer 324, as desired. In one instance the spacer layer may be formed with a thickness in the range of approximately 500–3000 Angstroms, although this is not required. A thicker layer may be desired in the event a less anisotropic spacer etch is used to form the source/drain spacers, as will be discussed further below.

FIG. 5F shows a cross-sectional view of a sixth intermediate transistor structure 500F containing liners 316A/B and source/drain spacers 318A/B at the left-hand and right-hand sides of the gate formed by removing portions of the liner layer 324 and spacer layer 326 of FIG. 5E until these layers are reduced to the liners 316A/B and spacers 318A/B. The portions are commonly removed with a substantially anisotropic etch having an etch chemistry that has a higher selectivity to etch the spacer layer compared to the liner layer so the etch slows or may be stopped at the liner layer. That is, the liner layer may serve at least in part as an etch stop. One anisotropic etch that is suitable for removing a silicon nitride spacer layer selectively while being sufficiently etch stopped by a silicon dioxide liner layer is based on sulfur hexafluoride ($SF_6$) nitride etch chemistry. The portions above the substrate regions for the source/drain terminals may be removed by the etch while the portions corresponding to the source/drain spacers may remain. The source/drain spacer etch may include an over etch phase that allows sufficient etching of the spacer layer from above the source/drain regions and from other regions where it is not desired. The liner layer has been removed from over the source, the drain, and the top of the gate. A subsequent silicide is often formed in these regions. As an option, a wet etch may be used after the anisotropic dry etch to tailor the structures and remove the remaining portions of the liner layer from over the source, drain, and top of the gate. One suitable wet etch is an isotropic buffered silicon dioxide wet etch containing hydrogen fluoride (HF) which is able to etch silicon dioxide faster than silicon. During such an etch, the source/drain spacers 318A/B mask and protect underlying and adjacent portions of the liners 316A/B to prevent these portions from being etched, while the etch is free to remove the portions of the liners 316A/B that overly the top of the gate and the source/drain terminal regions.

FIG. 5G shows a cross-sectional view of a seventh intermediate transistor structure 500G containing doped source/drain terminals formed in the substrate 302 at opposite sides of the insulated gate by using the outermost edges of the source/drain spacers 318A/B of FIG. 5F for alignment, according to embodiments of the invention. Often, the source/drain terminals are formed by a high energy, high dose blanket implant of dopant into the surface of the substrate in the regions corresponding to the source/drain terminals and, as desired, into the gate. The doping will often be achieved by ion implantation with a dose that is sufficient to achieve the desired conductivity and an implantation energy that is sufficient to achieve the desired depth or range. Conventional doses and energies may be used. The dopant is added to the source/drain terminal regions into alignment with the outer edge of the spacers. By including the source/drain spacers 318A/B, the doped source/drain terminals are offset from the extension regions, which may help to protect the extension regions from further doping while the heavily doped source/drain terminals are formed and thereby avoid altering the operational characteristics of the extension regions.

The transistor is often annealed in a conventional rapid thermal anneal process after the doping of the source/drain terminals in order to help electrically activate the doped terminals and extension regions. The dopants that are initially introduced into the substrate often occupy interstitial sites in the substrate. The anneal helps to move the dopants into lattice structure sites and helps to electrically activate the doped regions. One associated effect of the anneal is diffusion and lateral spreading of the extension region dopants so that they encroach further underneath the gate. The practitioner should take care during the anneal, as well as during other processes subsequent to the formation of the doped extension regions, to control the amount of thermal energy that is applied to the doped extension regions in order to avoid improper or irregular amounts of diffusion. If the tip region encroaches too far underneath the gate, capacitance may increase and negate advantages due to the insulating spacers adjacent to the sidewalls of the gate. Of course if the tip region does not encroach far enough underneath the gate, the channel may not have a sufficiently constant electric field, which may also degrade the performance of the transistor. It will be appreciated that a number of other conventional operations may be employed to complete the transistor. For example, refractory metal silicides may be formed on exposed silicon surfaces of the source/drain terminals and the gate and then electrical connections may be established to these silicide contacts. These operations will not be discussed further in order to avoid obscuring the concepts of the invention.

Accordingly, FIGS. 5A–5G show a method for fabricating a transistor containing insulating spacers formed on the sidewalls of the gate, according to embodiments of the invention. The fabricated transistor has a number of advantages. One advantage is that given appropriate control over the width of the insulating spacers, the formation of the extension regions, and thermally induced encroachment of the extension regions beneath the gate, the insulating spacers may help reduce the overlap of the extension regions with the gate. This may help reduce capacitance that slows the switching speed of the transistor and help reduce standby leakage current. Another advantage is that processing techniques to form notches in the gate, which are known to be problematic, may be avoided. Yet another advantage is a reduction in the gate width, as will be discussed below.

IV. Comparison To Prior Art Transistors

Figure 1:
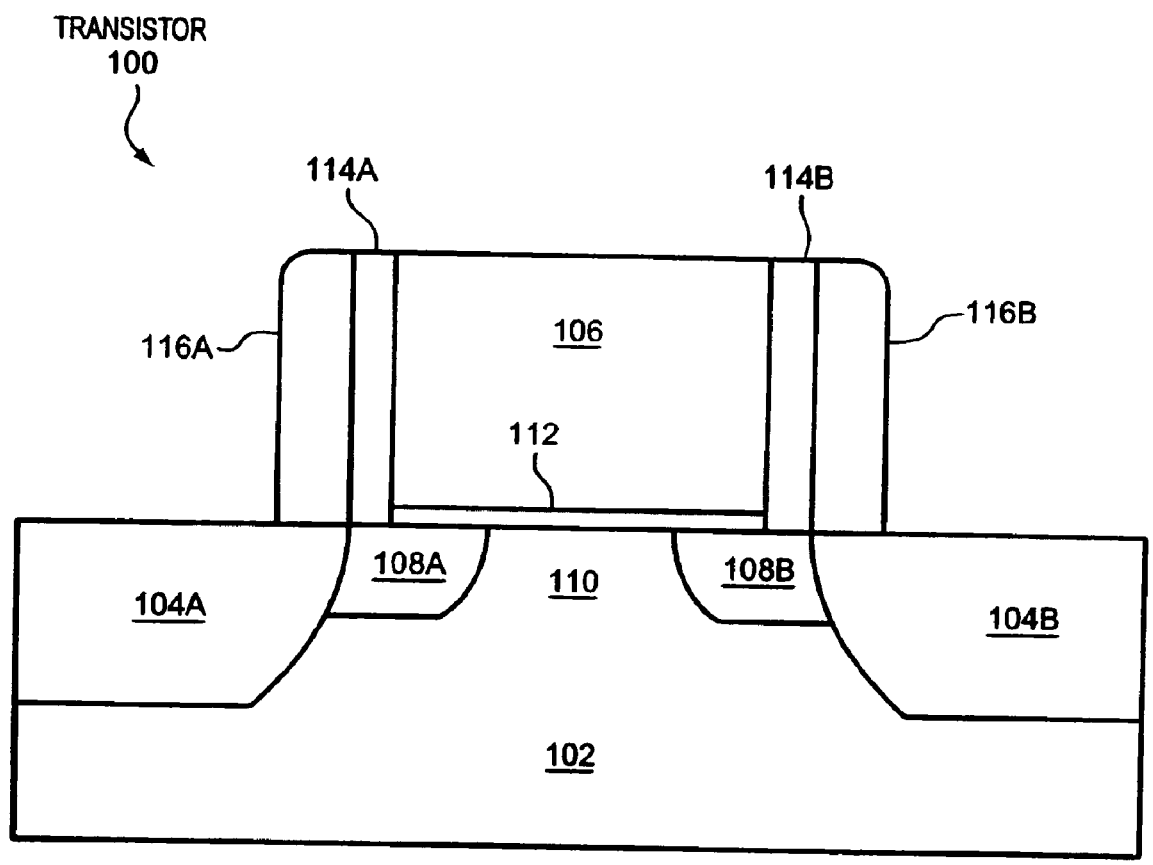
FIG. 1 shows a cross-sectional view of a prior art transistor that contains doped extension regions that underlap a gate.
Figure 2:
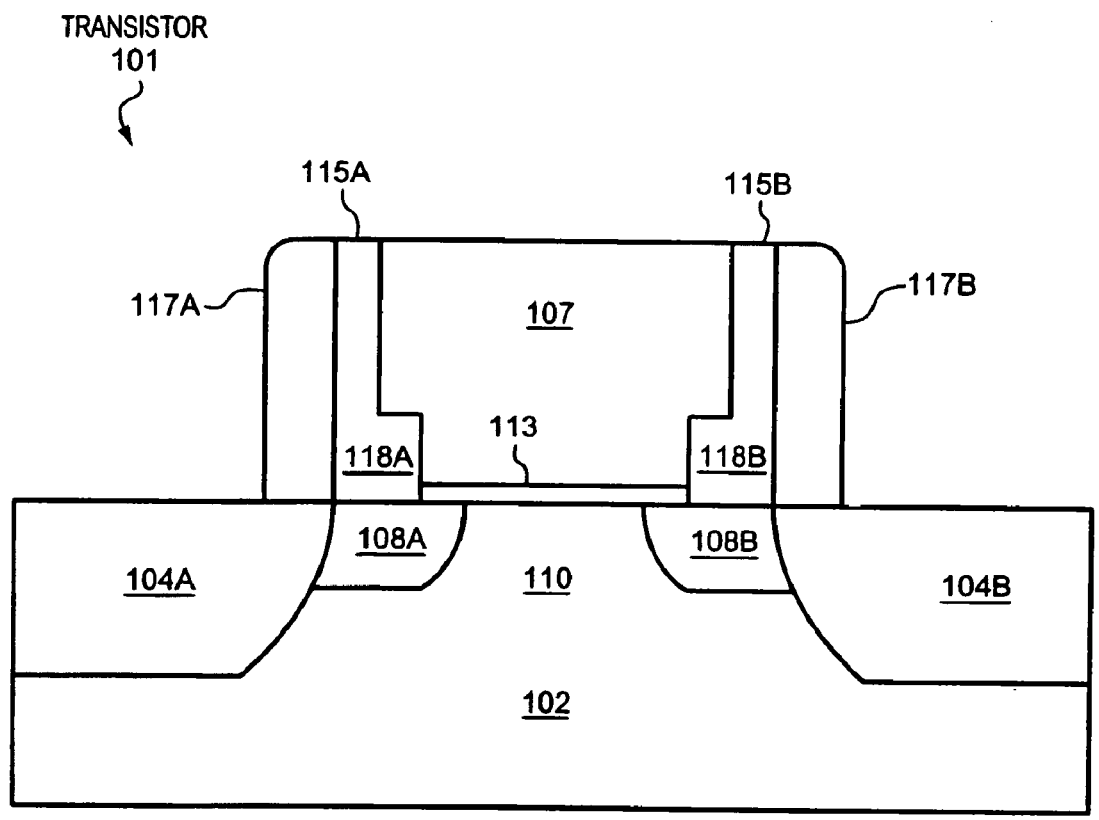
FIG. 2 shows a cross-sectional view of a prior art transistor that contains doped extension regions that underlap a notched gate.
Figure 6:
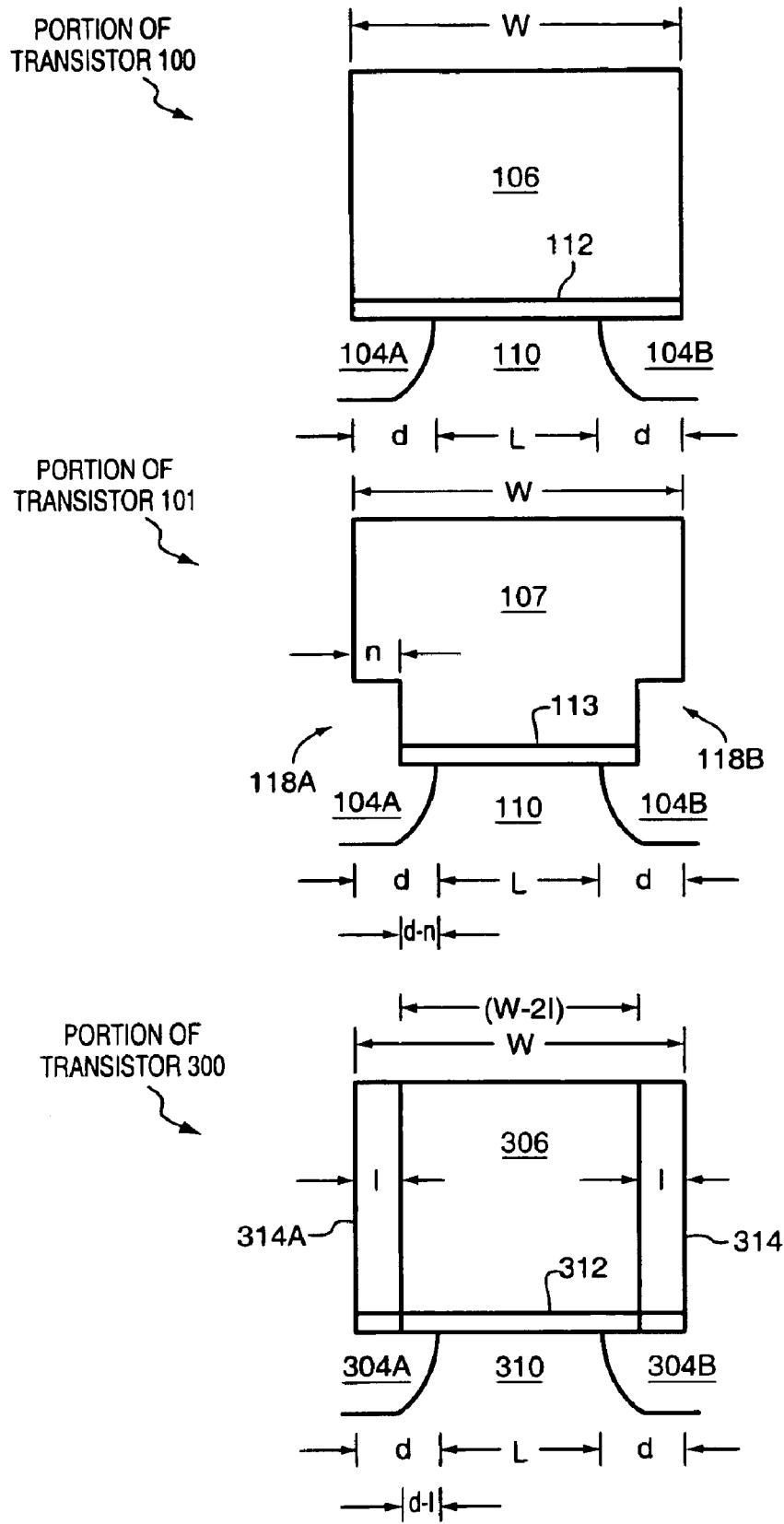
FIG. 6 shows a cross-sectional view of portions of the transistors shown in FIGS. 1, 2, and 3 and a relationship between overlap of the extension regions with the gates when the respective extension regions of these transistors are formed by an ion implantation process that respectively uses the gate of FIG. 1, the notched gate of FIG. 2, and the insulating sidewall spacers of FIG. 3 as an implantation alignment mask, according to embodiments of the invention.

FIG. 6 shows a cross-sectional view of portions of the transistors shown in FIGS. 1, 2, and 3 and a relationship between overlap of the extension regions with the gates when the respective extension regions of these transistors are formed by an ion implantation process that respectively uses the gate of FIG. 1, the notched gate of FIG. 2, and the insulating sidewall spacers of FIG. 3 as the alignment mask, according to embodiments of the invention. In the top transistor 100, the overlap between the extension region and the gate is represented by a distance d that is fixed by the ion implantation process and subsequent fabrication processes such as annealing. As shown, the overlaps in both the middle and bottom transistors 101 and 300 are less than that in the transistor 100 due to the notches and due to the insulating spacers offsetting the position of ion implantation from the gate. The overlap in the middle transistor 101 is about (d–n) where n is the width of the notches and the overlap in the bottom transistor 300 is about (d–l) where l is the width of the insulating sidewall spacers 314A/B. Advantageously, it may be easier to reliably control the thickness of the insulating spacers than the width of the notches.

A further advantage of the improved bottom transistor 300 over the prior art top and middle transistors 100–101 is a reduction in the gate length for a given channel length. As shown, the channel length L between the extension regions extending from the source/drain terminals is the same for each of the transistors. In the prior art transistors the lengths or widths at the top of the gates 106 and 107 are each the same, namely W, while the width at the top of the gate 306 of the improved transistor has been reduced by the combined thickness of the insulating sidewall spacers (i.e., the gate width is W–2 l). Accordingly, the improved transistor has similar channel-length related operational characteristics as the prior art transistors, while at the same time having a smaller critical dimension at the top of the gate. This reduced gate width may allow a higher transistor packing density due to relaxation of conservative tolerances during alignment of contacts with the source/drain terminals. As is well known, the process of alignment of the contacts with the source/drain terminals is uncertain it is standard practice to remove the intended contact position for the source/drain terminal from the edge of the gate with a certain conservative tolerance that accounts for the uncertainty and helps reduce the likelihood of forming a misaligned contact with the gate terminal, which may cause a short. The insulating sidewall spacers, and the reduced gate length, allow the intended contact position for the source/drain terminals to be moved closer to the edge of the gate, allowing higher transistor packing densities in integrated circuits. This of course offers a number of known advantages.

V. Use of Transistor In Electrical Systems

Figure 7:
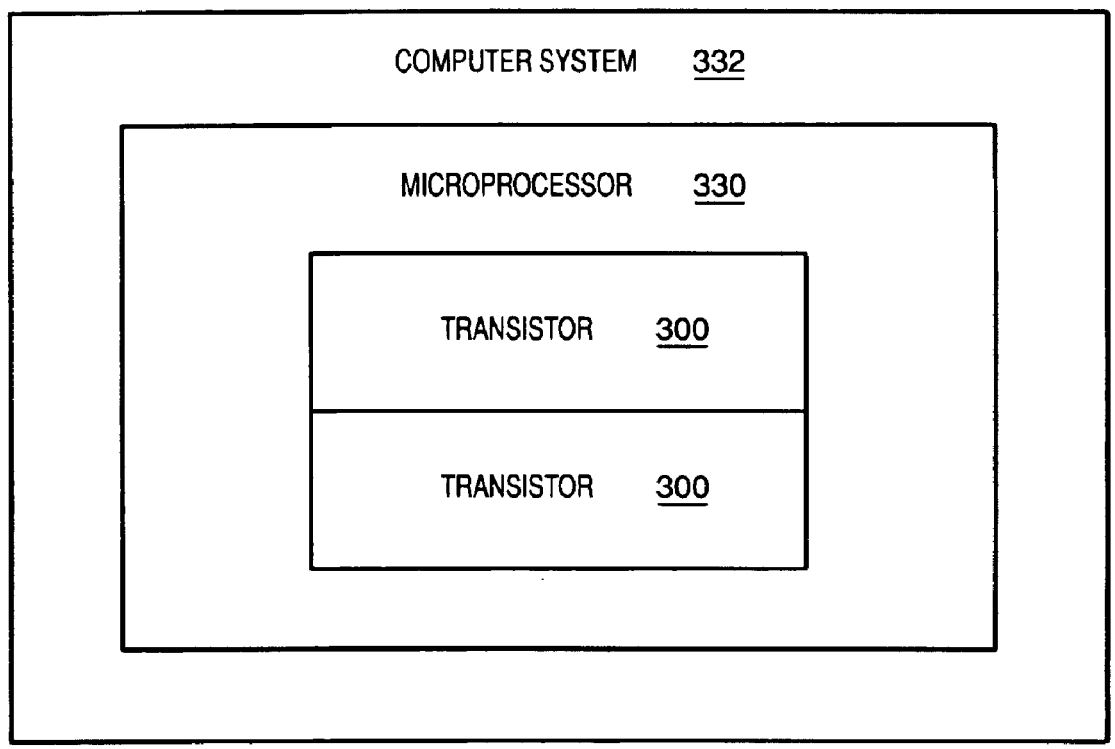
FIG. 7 shows that a transistor, according to embodiments of the invention, may be included in a microprocessor integrated circuit of a computer system.

FIG. 7 shows that transistors 300, according to various embodiments of the invention, may be used in a microprocessor 330 (or another integrated circuit, chip, monolith device, semiconductor device, or microelectronic device, as they are generally understood in the field) and incorporated into a computer system 332 (or other electrical system). The microprocessor may contain transistors in the form of microprocessor logic to execute instructions associated with the operation of the computer system. The computer system, which may be a portable, laptop, desktop, server, mainframe, or other computer system, may also contain other conventional computer system components, such as a bus to communicate data, a memory to store data (e.g., main memory, read only memory, and/or a mass storage device), a display device to display data, a data entry device (e.g., a keyboard, a cursor control device), and a communication device to link to other electrical systems.

Thus, transistors containing insulating spacers, methods for making the transistors, and integrated circuits and electrical systems containing the transistors have been disclosed. While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A transistor comprising:

a gate;

an insulator;

a channel beneath the gate and separated from the gate by the insulator;

a source adjacent to the channel on a first side of the gate;

a drain adjacent to the channel on a second side of the gate;

extension regions into the channel from the source and the drain that underlap the gate;

insulating spacers abutting sidewalls of the gate that overlap the extension regions, wherein amounts of underlap between the extension regions and the gate are based at least in part on a thickness of the insulating spacers, and wherein the thickness of the insulating spacers is from 10–200 Angstroms;

liners abutting the insulating spacers, wherein a thickness of the liners is from 10–300 Angstroms; and source/drain spacers abutting the liners, wherein a thickness of the source/drain spacers is from 500–3000 Angstroms, and wherein a material of the liners is more adhesive to a material of the insulating spacers than a material of the source/drain spacers.

2. The transistor of claim 1, wherein the thickness of the insulating spacers is from 20–100 Angstroms.

3. The transistor of claim 1, wherein the material of the insulating spacers comprises an oxide of silicon.

4. The transistor of claim 3, wherein the material of the source/drain spacers comprises a nitride of silicon.

5. The transistor of claim 4, wherein the material of the liners comprises a material selected from an oxide of silicon and an oxynitride of silicon.

6. The transistor of claim 1, wherein the material of the source/drain spacers comprises a nitride of silicon, and wherein the material of the liners comprises an etch stop material for the material of the source/drain spacers.

7. The transistor of claim 1, wherein the insulating spacers comprise a metal oxide.

8. The transistor of claim 1, wherein the insulating spacers comprise an organic material.

9. The transistor of claim 1, wherein the insulating spacers comprise a LPCVD material.

10. A transistor comprising:

a gate;

an insulator;

a channel beneath the gate and separated from the gate by the insulator;

a source adjacent to the channel on a first side of the gate;

a drain adjacent to the channel on a second side of the gate;

extension regions into the channel from the source and the drain that underlap the gate;

insulating spacers adjacent to sidewalls of the gate that overlap the extension regions, wherein amounts of underlap between the extension regions and the gate are based at least in part on thickness of the insulating spacers;

liners adjacent to the insulating spacers; and source/drain spacers adjacent to the liners, wherein a material of the source/drain spacers is different than a material of the liners.

11. The transistor of claim 10, wherein the material of the liners is more adhesive to a material of the insulating spacers than the material of the source/drain spacers.

12. The transistor of claim 11, wherein the material of the insulating spacers comprises an oxide of silicon.

13. The transistor of claim 12, wherein the material of the source/drain spacers comprises a nitride of silicon.

14. The transistor of claim 13, wherein the material of the liners comprises one or more selected from an oxide of silicon and an oxynitride of silicon.

15. The transistor of claim 10, wherein the material of the liners comprises an etch stop material for the material of the source/drain spacers.

16. The transistor of claim 10, wherein the insulating spacers comprise a metal oxide.

17. The transistor of claim 10, wherein the insulating spacers comprise an organic material.

18. The transistor of claim 10, wherein the insulating spacers comprise a LPCVD material.

19. The transistor of claim 10, wherein the thickness of the insulating spacers is from 10–200 Angstroms.

20. The transistor of claim 19, wherein the thickness of the insulating spacers is from 20–100 Angstroms.

21. The transistor of claim 19, wherein a thickness of the liners is from 10–300 Angstroms, and wherein a thickness of the source/drain spacers is from 500–3000 Angstroms.

22. The transistor of claim 10, wherein the insulating spacers abut the sidewalls of the gate.

* * * * *